(12) United States Patent
Malone et al.

(10) Patent No.: US 6,483,700 B1
(45) Date of Patent: Nov. 19, 2002

(54) AIR-FLOW BALANCING CARD GUIDE FRAME

(75) Inventors: Christopher Gregory Malone, Folsom, CA (US); Stephan Karl Barsun, Auburn, CA (US); Thomas J. Augustin, El Dorado Hills, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/932,035

(22) Filed: Aug. 17, 2001

(51) Int. Cl.[7] .............................................. H05K 7/20
(52) U.S. Cl. ...................... 361/690; 361/692; 361/694; 361/695; 174/15.1; 165/104.53; 454/184
(58) Field of Search ......................... 361/678, 690–695, 361/721, 741, 752, 756; 174/164; 165/80.3; 312/223.2; 211/41.17; 454/184

(56) References Cited

U.S. PATENT DOCUMENTS

| | | | | |
|---|---|---|---|---|
| 5,210,680 A | * | 5/1993 | Scheibler | 361/695 |
| 5,638,259 A | * | 6/1997 | McCarthy et al. | 361/800 |
| 6,128,187 A | * | 10/2000 | Mimlitch, III et al. | 361/690 |
| 6,201,711 B1 | * | 3/2001 | Cherniski et al. | 361/800 |
| 6,278,608 B1 | * | 8/2001 | Ater et al. | 361/695 |
| 6,280,317 B1 | * | 8/2001 | Przilas et al. | 454/184 |
| 6,322,175 B1 | * | 11/2001 | Aggus et al. | 312/223.2 |

* cited by examiner

Primary Examiner—Boris Chervinsky

(57) ABSTRACT

A method and apparatus to provide air-flow balancing with a card guide frame. One embodiment of the invention involves a method to assemble an air-flow balancing card guide frame and one or more substrates. A second embodiment of the invention involves a method to design an air-flow balancing card guide frame. A third embodiment of the invention involves an assembled air-flow balancing card guide frame and one or more substrates.

5 Claims, 6 Drawing Sheets

AIR-FLOW BALANCING CARD GUIDE FRAME

BACKGROUND OF THE INVENTION

1. Field of the Invention

This invention relates generally to a card guide frame to support one or more substrates, and more specifically relates to an air-flow balancing card guide frame to control air-flow and support one or more printed circuit board assemblies of IC components.

2. Description of the Prior Art

In many data processing systems (e.g., computer systems, programmable electronic systems, telecommunication switching systems, control systems, and so forth) very large pin count electrical components (e.g., application specific integrated circuits and processor chips) are assembled on substrates (e.g., printed circuit boards, other flexible substrates, multi-chip modules, and equivalents). These substrates are typically supported by metal card guides, which allow the substrates to be inserted or extracted from the data processing system. Card guides typically supply physical support and rigidity to the substrates, and help maintain the proper electrical connections between the substrates.

However, conventional card guides typically block the air-flow intended to dissipate the heat generated by the operation of the substrates, particularly the heat generated by the integrated circuits assembled on the substrates. Without a proper distribution of air-flow, the heat generation ultimately raises the temperature of the substrates, and causes either permanent or an intermittent failures in the operation of the data processing system. Therefore, the air-flow must be carefully balanced and distributed inside the data processing system to provide sufficient air-flow to each substrate. The air-flow is typically controlled and distributed by the insertion of separately fabricated metal plates with holes to direct and control the air-flow to each substrate.

FIG. 1 illustrates a conventional card guide frame 102 for supporting substrates, such as printed circuit boards (PCB). The illustrated conventional card guide frame 102 can support three substrates (not shown), using card guides 104, 108 and 112, which contain card sockets 106, 110, and 114, respectively. Here, the air-flow to each substrate can be optionally controlled by the labor-intensive attachment of individual air-flow control plates (not shown) between the card guides 104, 108, and 112.

Conventional card guides are typically fabricated from a thick, heavy metal plate, or they are fabricated from an expensive thermo-set composite material (e.g., a graphite fiber epoxy composite). Frequently, such card guides are constrained in thickness and dimensions by the increasing packing densities of nearby substrates. Thick and heavy card guides may touch and damage adjacent components on adjacent substrates, and can be especially detrimental to system reliability when the system is subject to shock and vibration. However, thin and light card guides may distort and fail to adequately support the substrate. Without an improved card guide frame to provide a necessary amount of air-flow balancing to each substrate, considerable labor and expense are required to control the air-flow to prevent overheating and subsequent substrate failures.

It would be desirable to provide an improved card guide frame that can distribute the necessary amount of air-flow to each substrate, and also provide the necessary amount of mechanical support to each substrate.

SUMMARY OF THE INVENTION

The present invention provides an improved card guide frame that can distribute the necessary amount of air-flow to each substrate, and also provide the necessary amount of mechanical support to each substrate.

A first aspect of the invention is directed to a method to assemble an air-flow balancing card guide and one or more substrates. The method includes perforating a material with a plurality of holes having pre-selected shapes and pre-selected hole Spacings; shaping the material to form one or more air-flow control panels and one or more card guides; and attaching one or more substrates to the one or more card guides, wherein the one or more air-flow control panels will use the plurality of holes to control air-flow to the one or more substrates.

A second aspect of the invention is directed to a method to design an air-flow balancing card guide frame. The method includes selecting a set of physical dimensions of the air-flow balancing card guide frame; modeling the air-flow balancing card guide frame after insertion of one or more substrates; estimating a more precise set of physical dimensions for the air-flow balancing card guide frame after modeling the air-flow balancing card guide frame with one or more substrates; and shaping the airflow flow balancing card guide frame according to said set of physical dimensions.

A third aspect of the invention is directed to an assembled air-flow balancing card guide frame and one or more substrates. The assembled air-flow balancing card guide frame includes one or more card guides and one or more air-flow control panels; and one or more substrates attached to the one or more card guides, wherein the one or more substrates receive a directional air-flow controlled by the one or more air-flow control panels.

These and other objects and advantages of the invention will become apparent to those skilled in the art from the following detailed description of the invention and the accompanying drawings.

DETAILED DESCRIPTION OF PREFERRED EMBODIMENTS OF THE INVENTION

The present invention provides an improved card guide frame with preformed air-flow control panels. This improved card guide frame supports multiple substrates, such as a printed circuit board (PCB) or multi-chip module substrates. While the discussion below is directed to an application of the invention to an assembled substrate card (e.g., a PCB), the invention can also be applied to other types of substrates (e.g., multi-chip modules, and other substrates upon which electrical components can be assembled).

Figure 1:
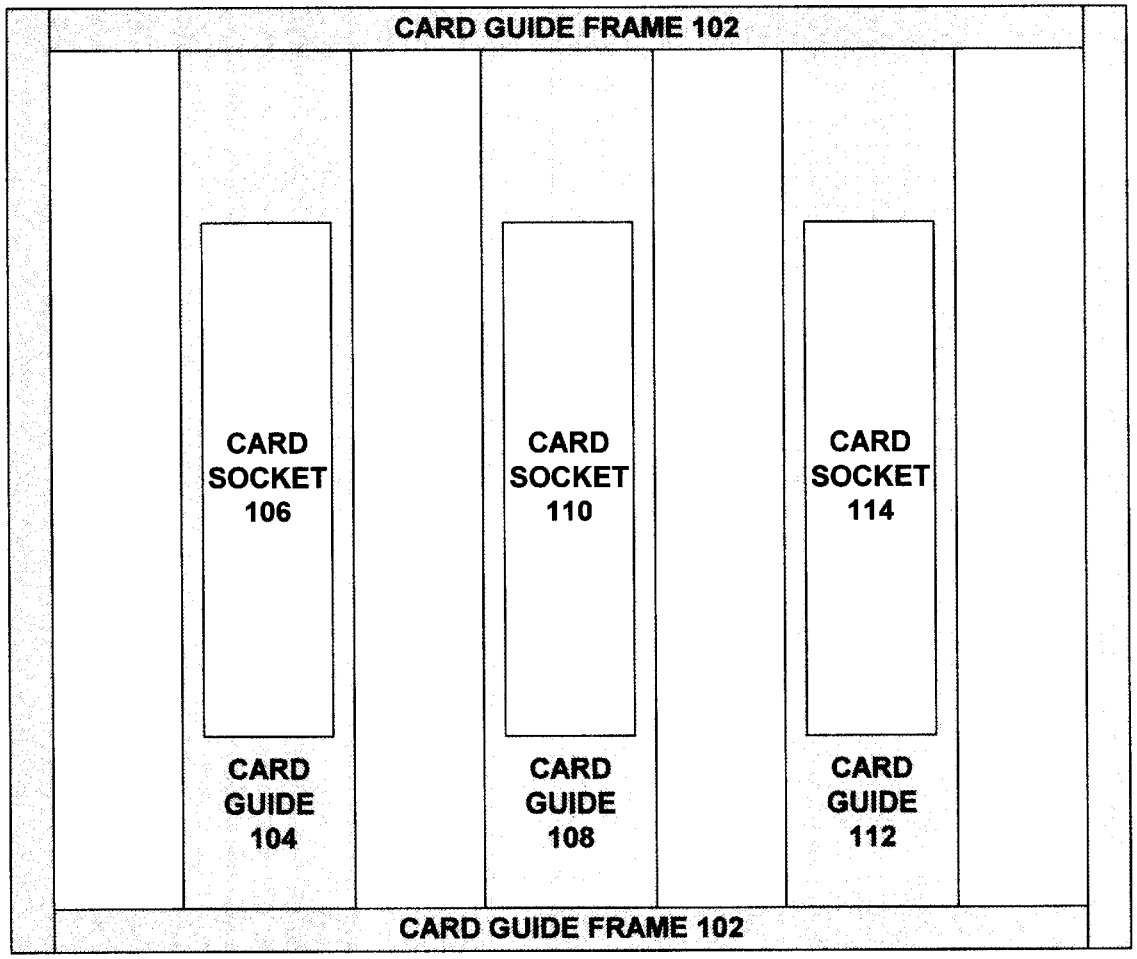
FIG. 1 illustrates a conventional card guide frame for supporting substrates, such as printed circuit boards (PCBs).
Figure 2:
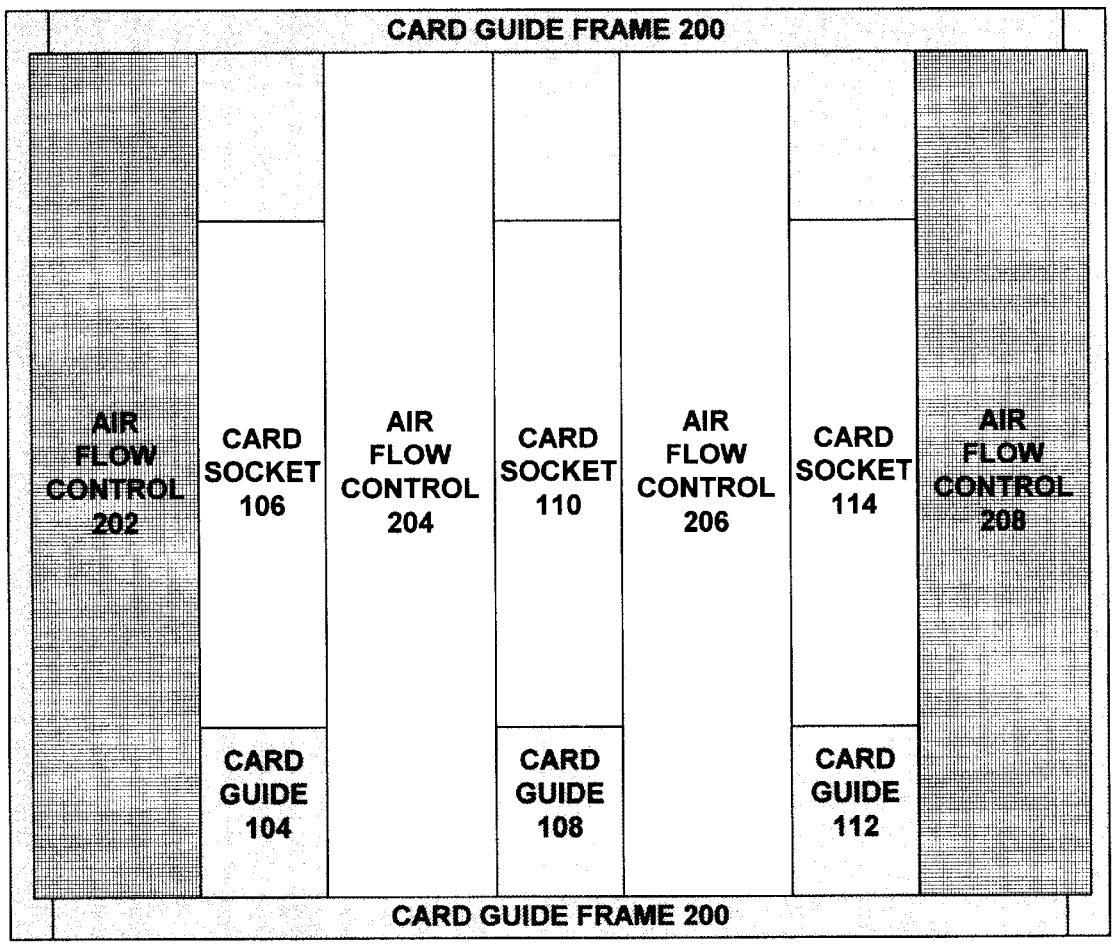
FIG. 2 illustrates one embodiment of an air-flow balancing card guide frame prior to insertion of the card substrates.

FIG. 2 illustrates one embodiment of an air-flow balancing card guide frame 200 prior to insertion of the card substrates. The card guide frame 200 includes card guides 104, 108, and 112, which contain card sockets 106, 110, and 114 respectively. In addition, card guide frame 200 can include air-flow control panels 202, 204, 206, and 208. In this embodiment, air-flow control panels 204 and 206 are absent for maximum air-flow. The air-flow balancing between multiple substrates can be implemented by cutting a plurality of holes of pre-selected shapes (e.g., circular holes, triangular holes, rectangular holes) and pre-selected spacings in the air-flow control panels of card guide frame 200 before it is shaped to form the card guides 104, 108, and 112.

The air-flow balancing card guide frame 200 can be fabricated from the following materials: a stainless steel alloy, a titanium steel alloy, a carbon steel alloy, a magnesium alloy, an aluminum alloy, a plastic, a glass-filled plastic, or a composite (e.g., a graphite fiber matrix). One preferred embodiment of the invention has an air-flow balancing card guide fabricated from a stainless steel alloy. Stainless steel is corrosion resistant and would not require plating or painting after stamping. Stainless steel also has sufficient strength and stiffness to allow for stamping and not require post-stamping heat treatment. This avoids the inherent warpage and distortion associated with heat-treating. The air-flow balancing card guide frame 200 can be fabricated from stamping a sheet of material, molding, machining, or a combination of processes.

Figure 3:
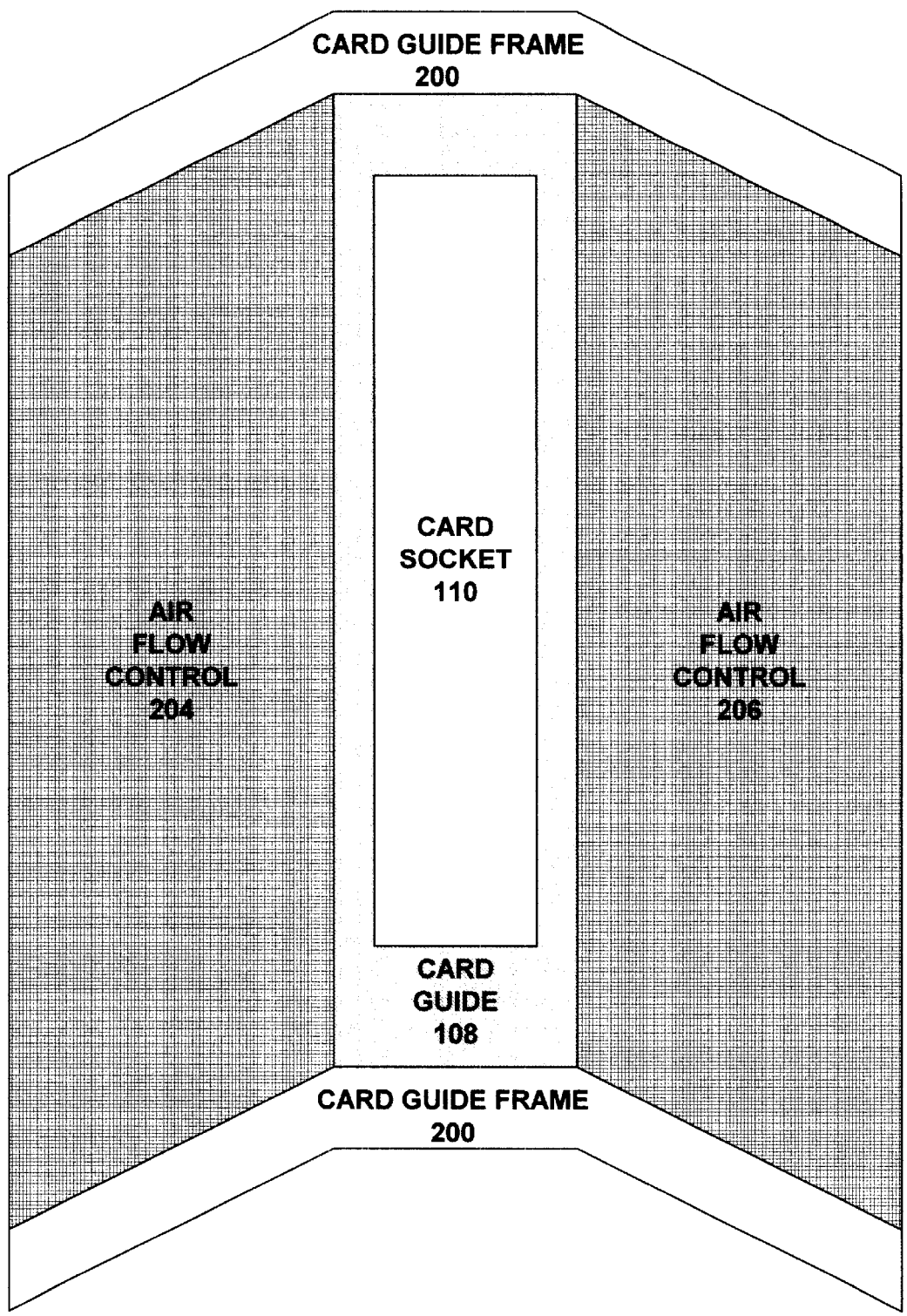
FIG. 3 illustrates a magnified perspective view of a section of an air-flow balancing card guide frame, in accordance to one embodiment of the present invention.

FIG. 3 illustrates a magnified perspective view of a section of an air-flow balancing card guide frame 200, in accordance to one embodiment of the present invention. Here, the card guide 108 includes a card socket 110 to support a substrate (not shown). Air-flow control panels 204 and 206 control the air-flow with a pre-selected density of perforations to control the volumetric air-flow rate in the air-flow channels on either side of card guide 108. The direction of the air-flow can be considered to be either into the plane of the drawing, or out of the plane of the drawing.

Figure 4:
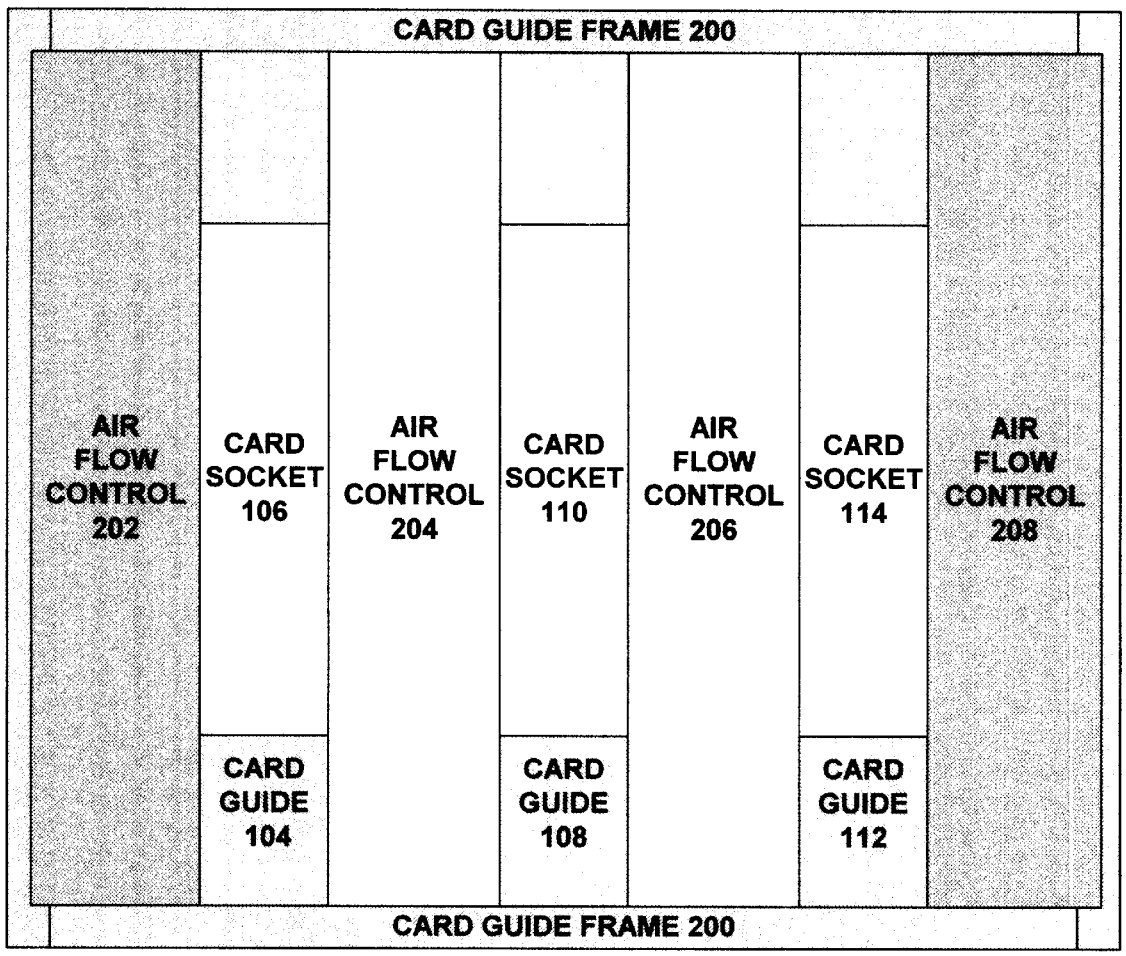
FIG. 4 illustrates another embodiment of an air-flow balancing card guide frame prior to insertion of the card substrates.

FIG. 4 illustrates another embodiment of an air-flow balancing card guide frame 200 prior to insertion of the card substrates. The card guide frame 200 includes card guides 104, 108, and 112, which contain card sockets 106, 110, and 114 respectively. In addition, card guide frame 200 can include air-flow control panels 202, 204, 206, and 208. In this embodiment, air-flow control panels 204 and 206 have a different density of perforations compared to the air-flow control panels 202 and 208.

Figure 5:
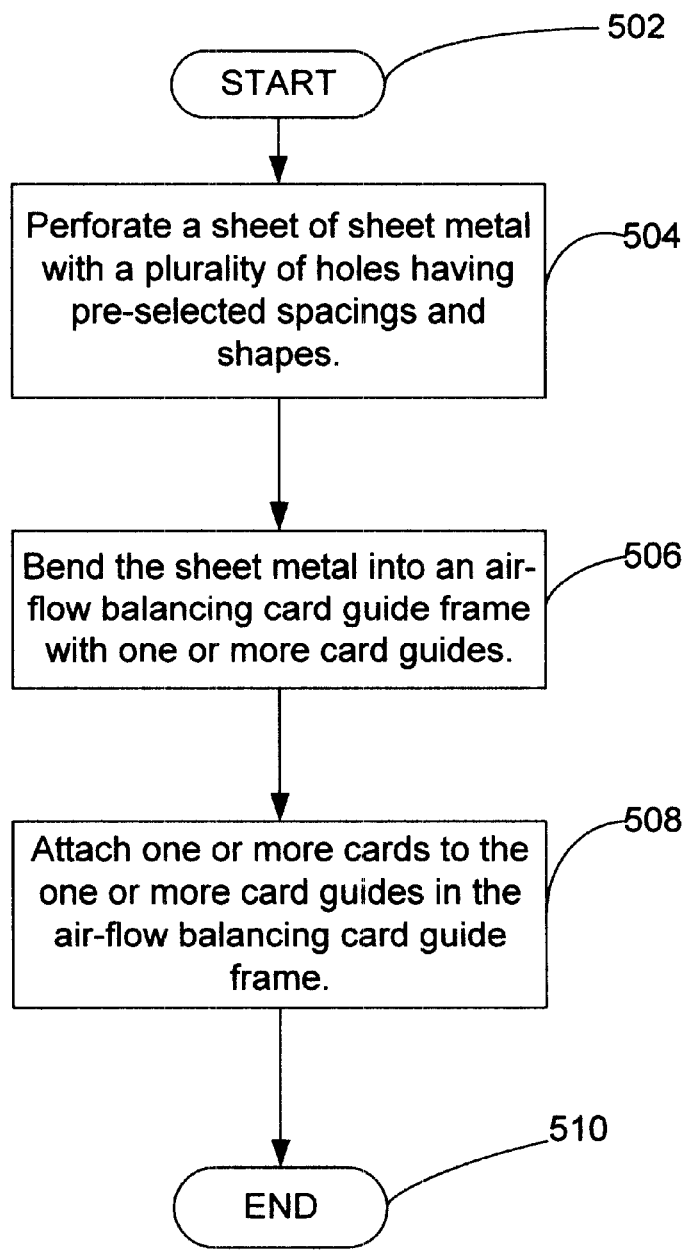
FIG. 5 shows one flow chart for a method to assemble one or more card substrates and an air-flow balancing card guide frame in accordance with one embodiment of the present invention.

FIG. 5 shows one flow chart for a method to assemble one or more card substrates and an air-flow balancing card guide frame in accordance with one embodiment of the present invention. The method starts in operation 502, and is followed by operation 504. In operation 504, a sheet of sheet metal is perforated with holes having pre-selected spacings and shapes. In preferred embodiments of the present invention, the sections of the sheet metal that are intended to be shaped into the actual card guides would not normally be perforated. Operation 506 is next, where the sheet metal is then shaped (e.g., by stamping, machining, or an equivalent method) to form the air-flow card guide frame into one or more card guides and one or more air-flow control panels.

Operation 508 is next, where the cards are assembled into the air-flow card guide frame. Operation 510 is the end of the method.

Figure 6:
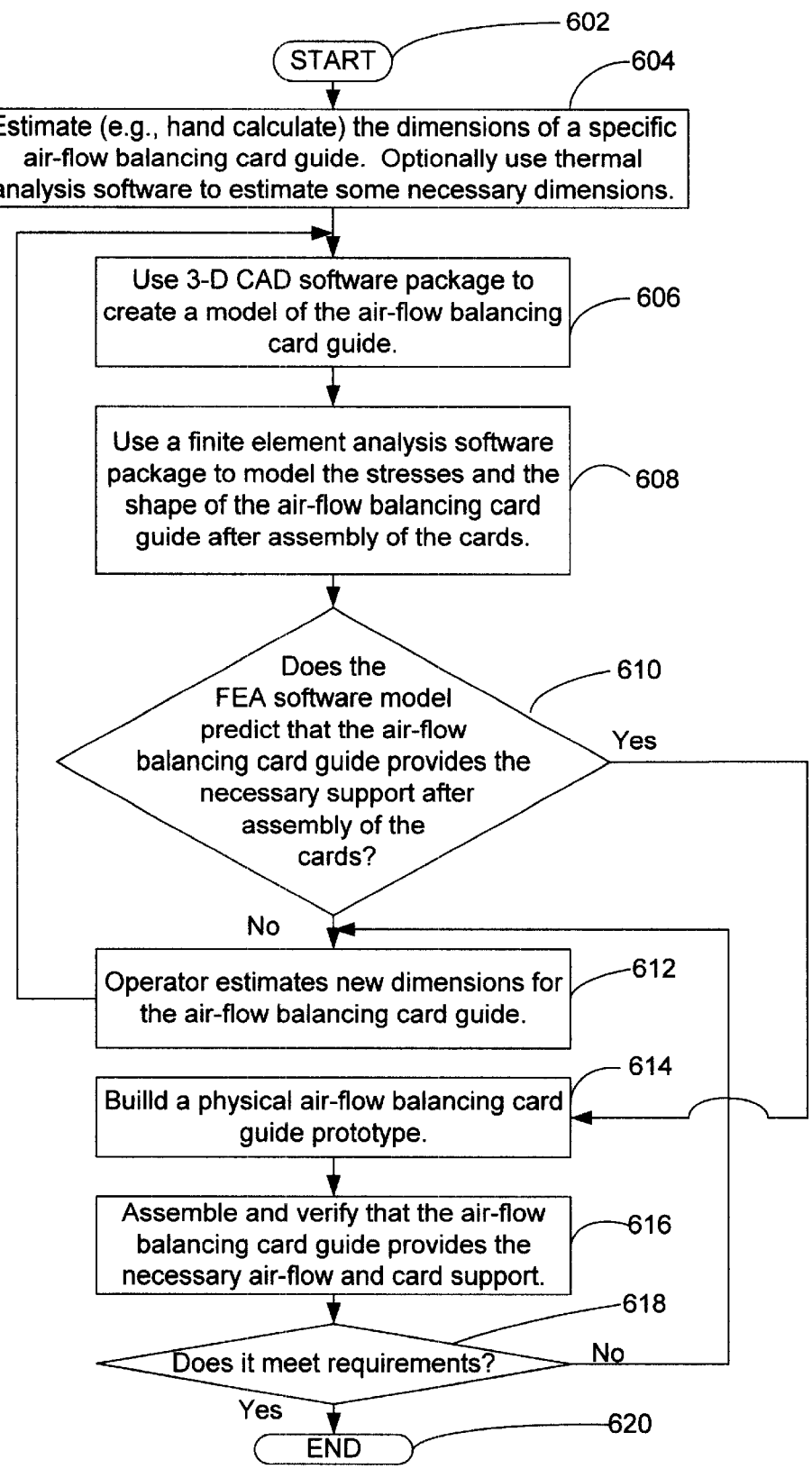
FIG. 6 shows a flow chart for a method to fabricate an air-flow balancing card guide frame in accordance with one preferred embodiment of the present invention.

FIG. 6 shows a flow chart for a method to fabricate an air-flow balancing card guide frame in accordance with one preferred embodiment of the present invention. The method starts in operation 602, and is followed by operation 604. In operation 604, a hand calculation is made of the necessary card guide frame rigidity and air-flow balancing needed for one or more assembled substrates. Optionally, thermal analysis software is used to estimate the air-flow balancing requirements. The use of thermal analysis software is discussed in more detail below. In operation 606, a 3-D computer aided design (CAD) software package (e.g., Pro/ENGINEER, available from PTC Corporation with corporate headquarters in Needham, Massachusetts; SolidDesigner, available from CoCreate Software, Inc. with corporate headquarters in Fort Collins, Colorado; SolidWorks, available from SolidWorks Corporation with corporate headquarters in Concord, Mass.; or an equivalent CAD package) is used to create a model of the air-flow balancing card guide frame assuming the previously estimated dimensions. Then operation 608 is next. In operation 608, a finite element analysis (FEA) software package (e.g., Pro/MECHANICA, available from PTC Corporation with corporate headquarters in Needham, Massachusetts; Ansys, available from Ansys, Inc. with corporate headquarters in Canonsburg, Pa.; Cosmos, available from Structural Research & Analysis Corporation with corporate headquarters It's in Los Angeles, Calif.; or an equivalent FEA package) is used to model the stresses and the predict the final shape of the air-flow balancing card guide frame after assembly of the cards into the air-flow balancing card guide frame. In operation 610, a test is made to determine if the FEA software package predicts that that the air-flow balancing card guide frame provides sufficient substrate support and a sufficiently distributed air-flow after insertion of the substrates. If the test of operation 610 determines that the air-flow balancing card guide will not provide sufficient substrate support or not provide sufficiently distributed air-flow, operation 612 is next where the operator decides on new dimensions for the air-flow balancing card guide frame. Then operations 606, 608, and 610 are repeated. If the test of the operation 610 determines that the air-flow balancing card guide frame will provide sufficient substrate support and a sufficient air-flow distribution, then operation 614 is next. In operation 614 a physical prototype of the air-flow balancing card guide frame is fabricated. Operation 616 is next, where the fully operational cards are inserted in the card guides of the air-flow balancing card guide frame to verify that the air-flow balancing card guide frame will be sufficient in card support and in air-flow distribution. Then operation 618 is next, where a test is made to determine if the air-flow balancing card guide frame meets the requirements. If the test of operation 618 verifies that the air-flow balancing card guide frame does not provide sufficient support or sufficient air-flow to the cards, then operation 612 is next. If the test of operation 618 verifies that the air-flow balancing card guide frame meets all requirements, then the method ends in operation 620.

In more preferred embodiments, thermal analysis software is used in advance of the detailed mechanical design steps involving CAD and stress analysis. The thermal analysis software is used to determine the air-flow rate and the temperature requirements for the different subsystems in the data processing system. In preferred embodiments, the thermal analysis software determines the acceptable card pitch and the required air-flow distribution in the data processing system. The air-flow distribution is determined by the pressure drop across the card guide. The proper distribution of air-flow for the data processing system is achieved by increasing or decreasing the obstruction to air-flow at various locations on the card guide. The level of obstruction to air-flow is modified by varying the perforation pattern (e.g., the percentage of open area, hole size, shape, and so forth). The thermal analysis software is used to determine the air-flow distribution and to design the required perforation pattern.

Once these parameters have been determined, an operator can design a card guide frame with the proper strength, ease-of-use, lowest cost, and so forth. Thermal analysis software comes in many variations, but the preferred technique for analyzing this class of problem is Computational Fluid Dynamics (CFD). Commercial codes are available from several vendors, including Flomerics with corporate headquarters in Surrey, United Kingdom, and a website at (httD://www.flotherm.com/), which makes a CFD software product called Flotherm. CFD codes calculate 3-dimensional solutions of the Navier-Stokes equations, which govern fluid flow and heat transfer, and enable the calculation of the air-flow and temperatures inside the data processing system.

The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. An air-flow balancing card guide frame assembly comprising:
   an air-flow balancing card guide frame; and
   one or more air-flow control panels coupled to said air-flow balancing card guide frame, wherein said one or more air-flow control panels are perforated, said air-flow control panel oriented such that when a substrate is coupled to said air-flow balancing card guide frame, said air-flow control panel will be disposed in a plane substantially parallel to a plane in which said substrate resides, said one or more air-flow control panels for controlling air flow to said substrate.

2. The air-flow balancing card guide frame assembly of claim 1, wherein said substrate is selected from the group of substrates consisting of: a printed circuit board (PCB), a multi-chip module (MCM), and a flexible substrate.

3. The air-flow balancing card guide frame assembly of claim 1, further comprising one or more electrical components.

4. The air-flow balancing card guide frame assembly of claim 1, wherein said air-flow balancing card guide is fabricated from a material selected from the group of materials consisting of: a stainless steel alloy, a titanium steel alloy, a carbon steel alloy, a magnesium alloy, an aluminum alloy, a plastic, a glass-filled plastic, or a composite.

5. The air-flow balancing card guide frame assembly of claim 1, wherein said air-flow balancing card guide frame is shaped from a sheet of sheet metal.

* * * * *